United States Patent [19]

Zarreii

[11] Patent Number: 5,726,867
[45] Date of Patent: Mar. 10, 1998

[54] CARD HOLDER FOR COMPUTERS AND RELATED EQUIPMENT

[75] Inventor: Mansour Zarreii, Mechanicsburg, Pa.

[73] Assignee: The Whitaker Corporation, Wilmington, Del.

[21] Appl. No.: 184,523

[22] Filed: Jan. 21, 1994

[51] Int. Cl.$^6$ ................................................ H05K 9/00
[52] U.S. Cl. ........................ 361/818; 174/35 R; 174/51; 361/737
[58] Field of Search .................................. 235/380, 441, 235/492; 361/728–732, 752–753, 759, 736–737, 740, 816–818; 174/51, 35 R, 35 MS; 439/607–610

[56] References Cited

U.S. PATENT DOCUMENTS

| | | |
|---|---|---|
| 3,852,124 | 12/1974 | Fassell . |
| 4,252,620 | 2/1981 | Tomita . |
| 4,419,409 | 12/1983 | Kushida et al. ........................ 428/469 |
| 4,458,967 | 7/1984 | King et al. . |
| 4,466,687 | 8/1984 | Frantz . |
| 4,872,091 | 10/1989 | Maniwa et al. . |
| 4,903,402 | 2/1990 | Norton et al. ........................... 29/843 |
| 4,929,195 | 5/1990 | Seidoh ................................. 439/610 |
| 4,952,161 | 8/1990 | Komatsu ............................... 439/155 |
| 4,955,817 | 9/1990 | Sugai ................................... 439/60 |
| 5,005,106 | 4/1991 | Kiku . |
| 5,038,250 | 8/1991 | Uenaka et al. . |
| 5,053,613 | 10/1991 | Onoda ................................. 235/492 |
| 5,053,924 | 10/1991 | Kurgan . |
| 5,149,276 | 9/1992 | Dixon ................................. 439/159 |
| 5,153,818 | 10/1992 | Mukougawa et al. . |
| 5,189,638 | 2/1993 | Kimura ................................. 365/52 |
| 5,206,796 | 4/1993 | Thompson et al. . |
| 5,231,274 | 7/1993 | Reynier et al. ........................ 235/441 |
| 5,234,351 | 8/1993 | Dixon ................................. 439/160 |
| 5,244,397 | 9/1993 | Anhalt ................................. 439/101 |
| 5,288,247 | 2/1994 | Kaufman ............................... 439/607 |
| 5,290,174 | 3/1994 | Woratyla et al. ...................... 439/59 |
| 5,339,222 | 8/1994 | Simmons et al. ...................... 361/818 |

OTHER PUBLICATIONS

PCMCIA (Personal Computer Memory Card International Association); "PC Card Standard"; Sep. 1991; 41 pages.
Memory/PC Card Connector (Compatible with PCMIA, Release 2.0); revised Dec. 1991.

*Primary Examiner*—Bot L. Ledynh
*Attorney, Agent, or Firm*—Katherine A. Nelson

[57] ABSTRACT

A card holder (10) for a card (11), such as a PCB, includes a bottom member (13) and a top cover (14) which easily snap together to enclose the card (11) therebetween. The bottom member (13) may be made from a precision hot-flow semi-solid aluminum forging operation, and the top cover (14) may be made as an aluminum stamping. The overall assembly of the card holder (10) has high mechanical strength and rigidity, and the top member (14) merely serves as a cover. A substantially complete EMI shielding is provided, and both members are hard anodized for electrical insulation. The card holder (10) is cost-effective, yet rugged and reliable, and the anodizing provides a pleasing product appearance. An injection molding operation is not necessary, and a separate plastic part is eliminated.

8 Claims, 5 Drawing Sheets

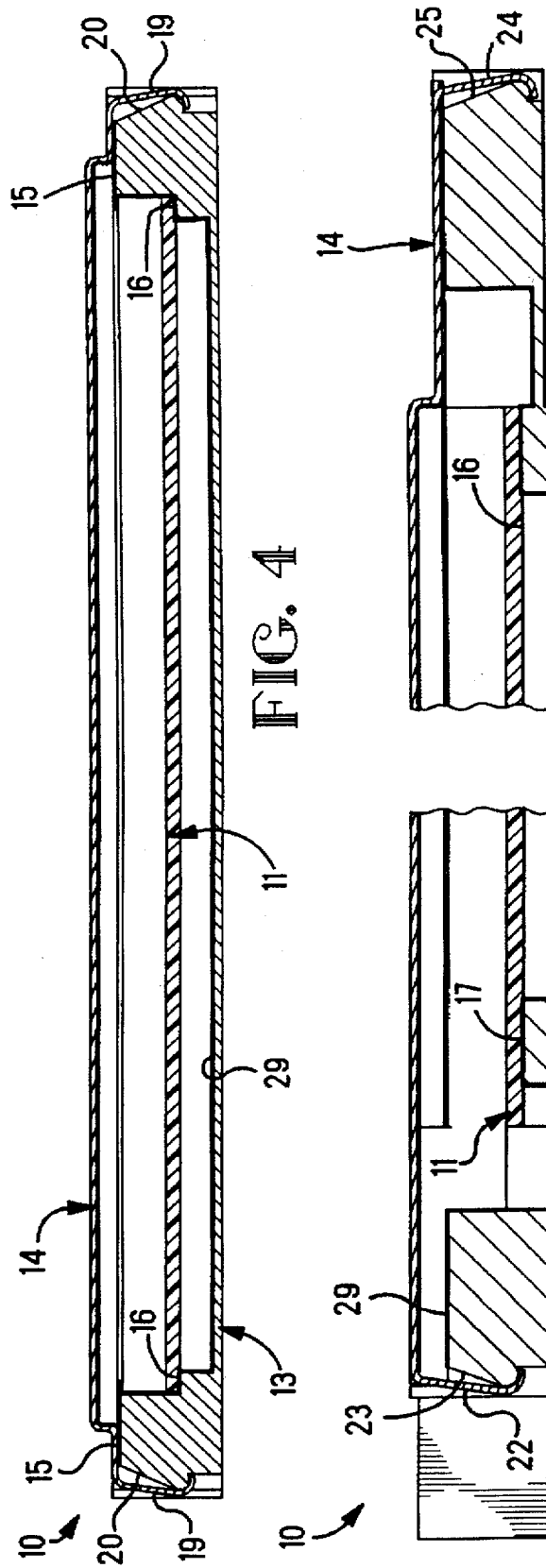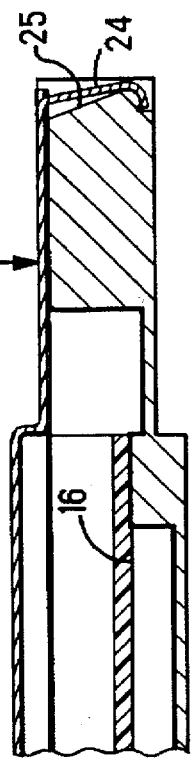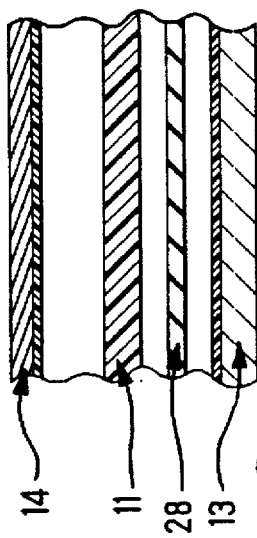

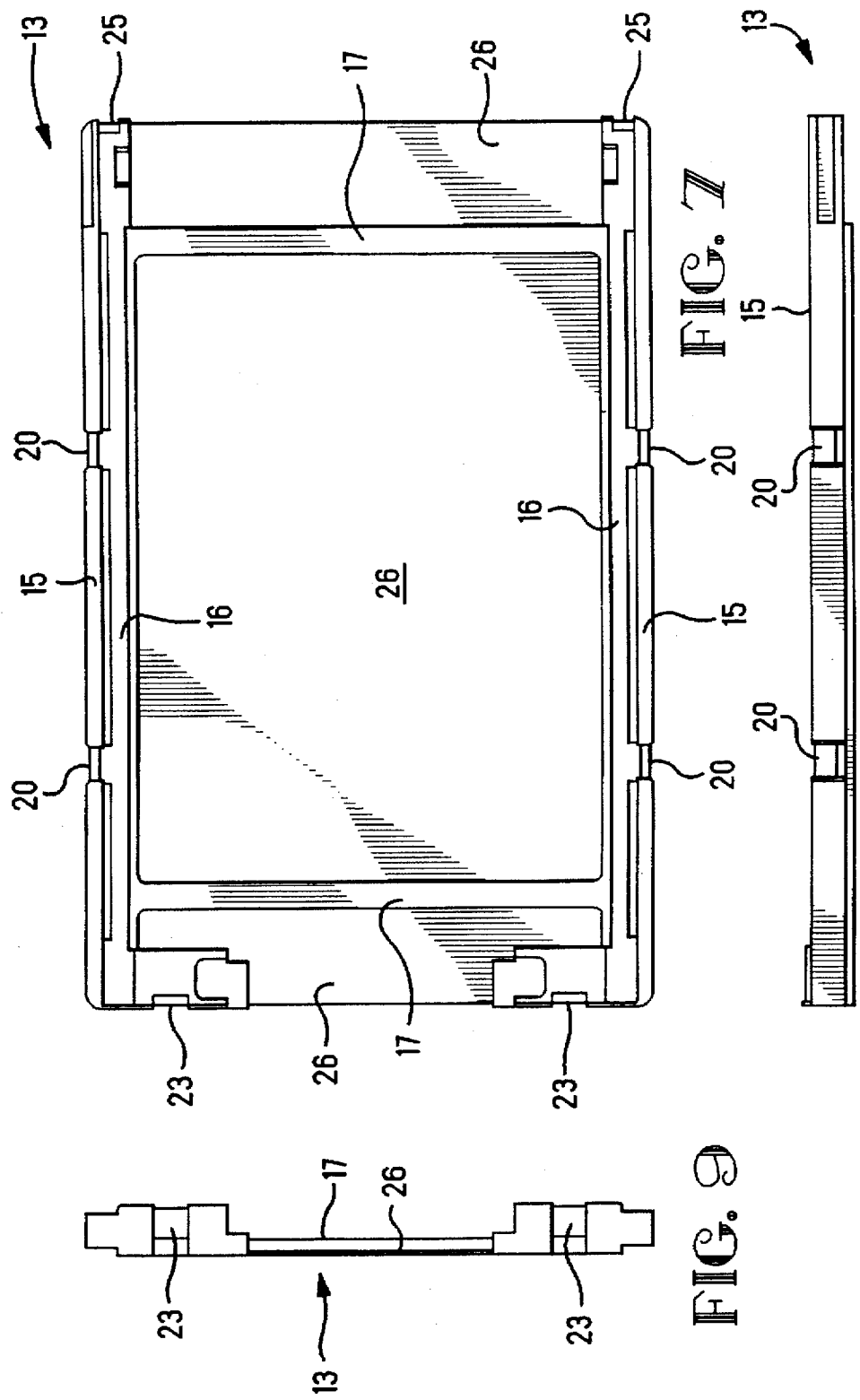

CARD HOLDER FOR COMPUTERS AND RELATED EQUIPMENT

FIELD OF THE INVENTION

The present invention relates to a card holder for computers or for computer-related electronic equipment, and more particularly, to a shielded card holder for those applications using an I/O connector (such as fax/modems or LAN adapter cards).

BACKGROUND OF THE INVENTION

Computers, as well as sophisticated electronic equipment having computer capabilities, may be equipped to receive a memory card or the like which may be in the form of a printed circuit board ("PCB"). For example, and as disclosed in U.S. Pat. No. 5,038,250 to Uenaka et al, a PCB is mounted in a molded plastic frame; and the plastic frame, in turn, is mounted between a pair of stamped metal covers, thereby forming a card holder or assembly.

An improvement is disclosed and claimed in co-pending application, Ser. No. 08/043,316 filed on Apr. 6, 1993 and assigned to the assignee of the present invention. In this co-pending '316 application, the bottom cover member is integrally molded with the frame for the card; the card is inserted therein, and the top cover is snapped over the bottom member and is retained thereon by cooperating respective flanges or crimps.

These prior art structures (and, especially, the molded plastic frame) do not have the desired relatively-high mechanical strength and rigidity, especially for Data Access Arrangement ("DAA") for modems or Media Access Module ("MAA") for Local Area Network ("LAN") adapters which are connected to the I/O connector. A pivot action may develop tending to bend the frame or separate the covers. During repeated usage, this changes the thickness of the card and causes a fit problem, which may bow the PCB and crack its solder joints, thereby precipitating a product failure.

In a standard industry test, one end of the card holder is rigidly clamped, and the other end of the card holder is raised by 10°. Breakage of the card holder or loosening of its components, which constitutes a test failure, may occur no matter how hard the assembly is crimped together.

In addition, the top cover, frame, PCB and bottom cover must be carefully aligned, properly fixtured in an arbor press or its equivalent, and pressed together with a relatively high force to snap the covers over the frame. This is time consuming and expensive. Moreover, in most cases, an adhesive is used along the connector and snap areas to increase the rigidity of the assembly. The adhesive is messy, must be properly cured, and is difficult to handle in a high-volume manufacturing operation.

Since the metallic covers may short the leads of any surface-mounted discrete components on the PCB, an insulating tape is often applied to each cover. This further increases manufacturing costs and detracts from product reliability.

SUMMARY OF THE INVENTION

Accordingly, it is the object of the present invention to provide a card holder having a rugged and reliable assembly so as to preclude movement between the frame and the cover.

It is another object of the present invention to provide such an assembly having high mechanical strength and structural rigidity, particularly for product applications having I/O connectors for fax/modems or LAN adapter cards.

It is yet another object of the present invention to provide a low-cost assembly that does not require any special tools, fixtures, arbor presses or adhesives.

It is a further object of the present invention to provide a rugged low-cost shielded card holder, one which meets all of the requirements of E.M.I. shielding and electrical insulation.

In accordance with the teachings of the present invention, a preferred embodiment thereof is herein disclosed, wherein a single unitary bottom member is formed as a hot-flow semi-solid forging of an aluminum material, thereby providing a precision part serving directly as a rigid frame for the card. A top member is snapped over the bottom member to complete the assembly of the card holder. This top member serves merely as a cover without being required to generate mechanical strength in the assembly. The top member may comprise a stamping, such as an aluminum stamping, and the aluminum material of the members provides good EMI shielding. Each of the members may be hard anodized, thereby providing for electrical insulation between the card and the members. The hard anodizing also provides a good background color (or contrasting color) for stenciling, thereby improving the product appearance.

In another embodiment, the unitary bottom member is die-cast aluminum.

These and other objects of the present invention will become apparent from a reading of the following specification taken in conjunction with the enclosed drawings.

BRIEF DESCRIPTION OF THE DRAWINGS

FIG. 4 is a cross-sectional view taken along the lines 4—4 of FIG. 1

FIG. 5 is a cross-sectional view taken along the lines 5—5 of FIG. 1

FIG. 6 is a portion of FIG. 3, drawn to an enlarged scale, and showing a separate insulation layer between the respective planar surfaces of the card and the bottom member.

FIG. 7 is a top plan view of the bottom member.

FIG. 8 is a side elevational view thereof.

FIG. 9 is an end view thereof.

GENERAL DESCRIPTION OF THE PREFERRED EMBODIMENT

Figure 1:
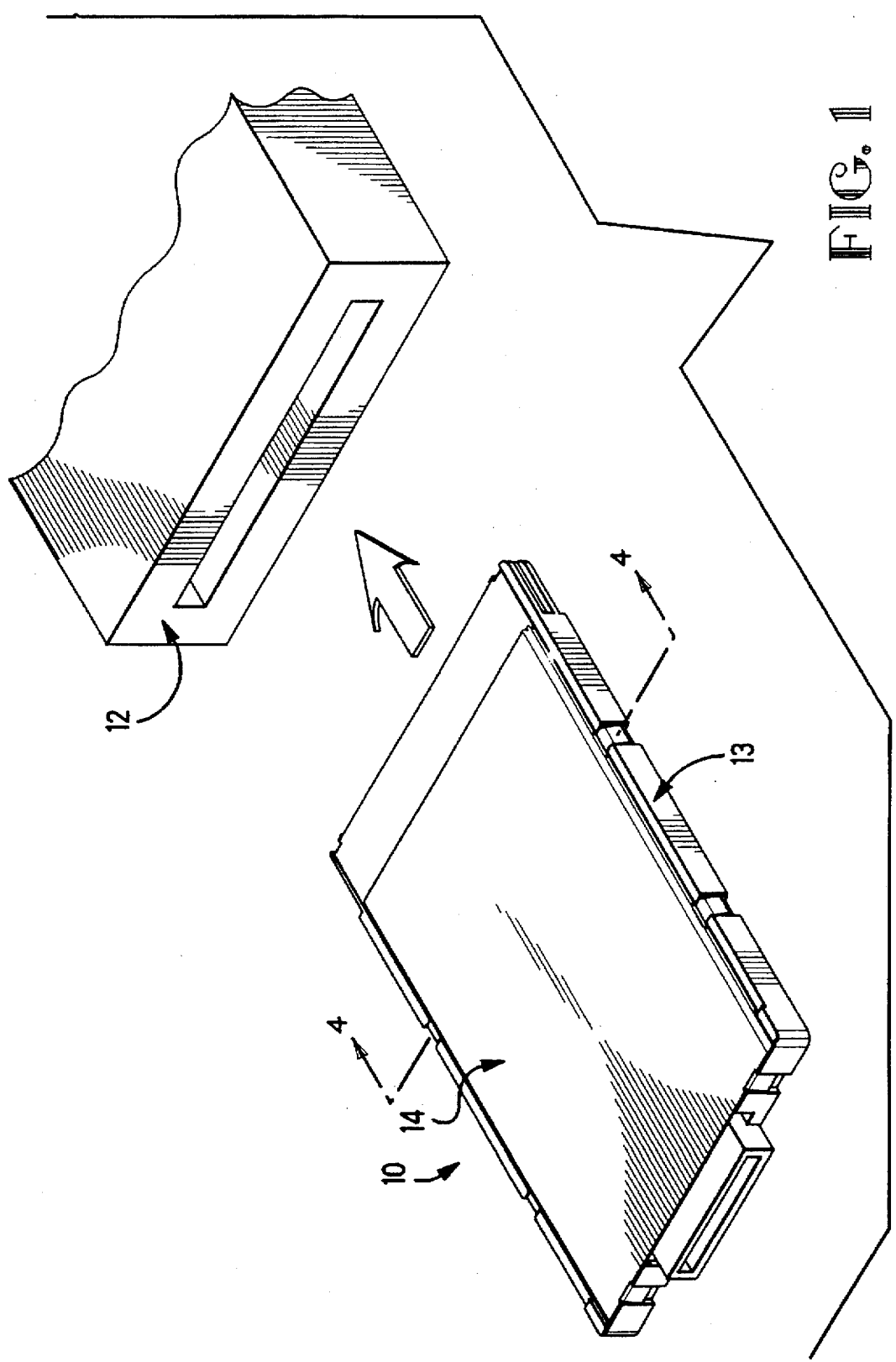
FIG. 1 is a perspective view of a shielded card holder of the present invention shown in exploded relationship to a computer.
Figure 2:
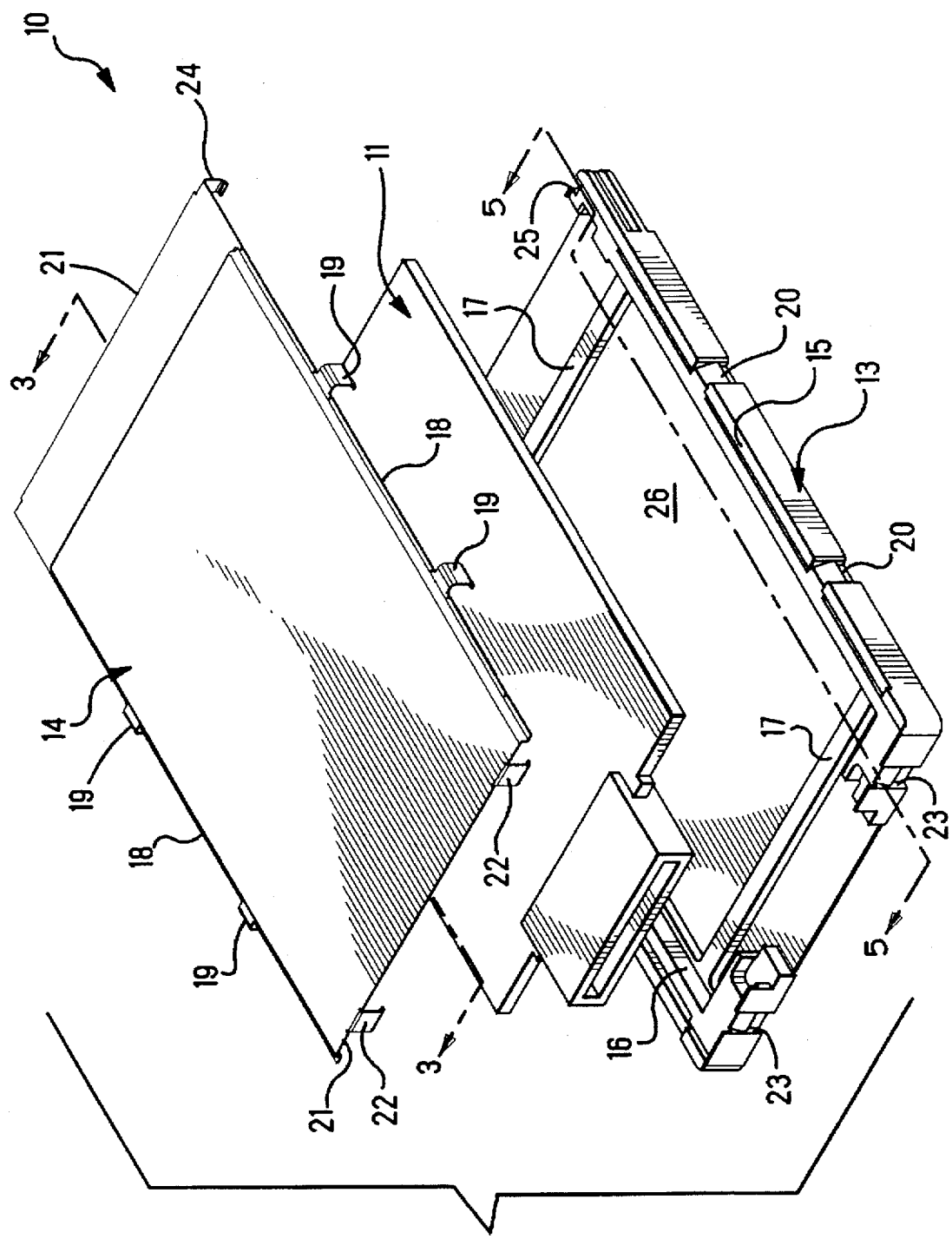
FIG. 2 is an exploded perspective view of the major components of the shielded card holder shown in FIG. 1.
Figure 3:
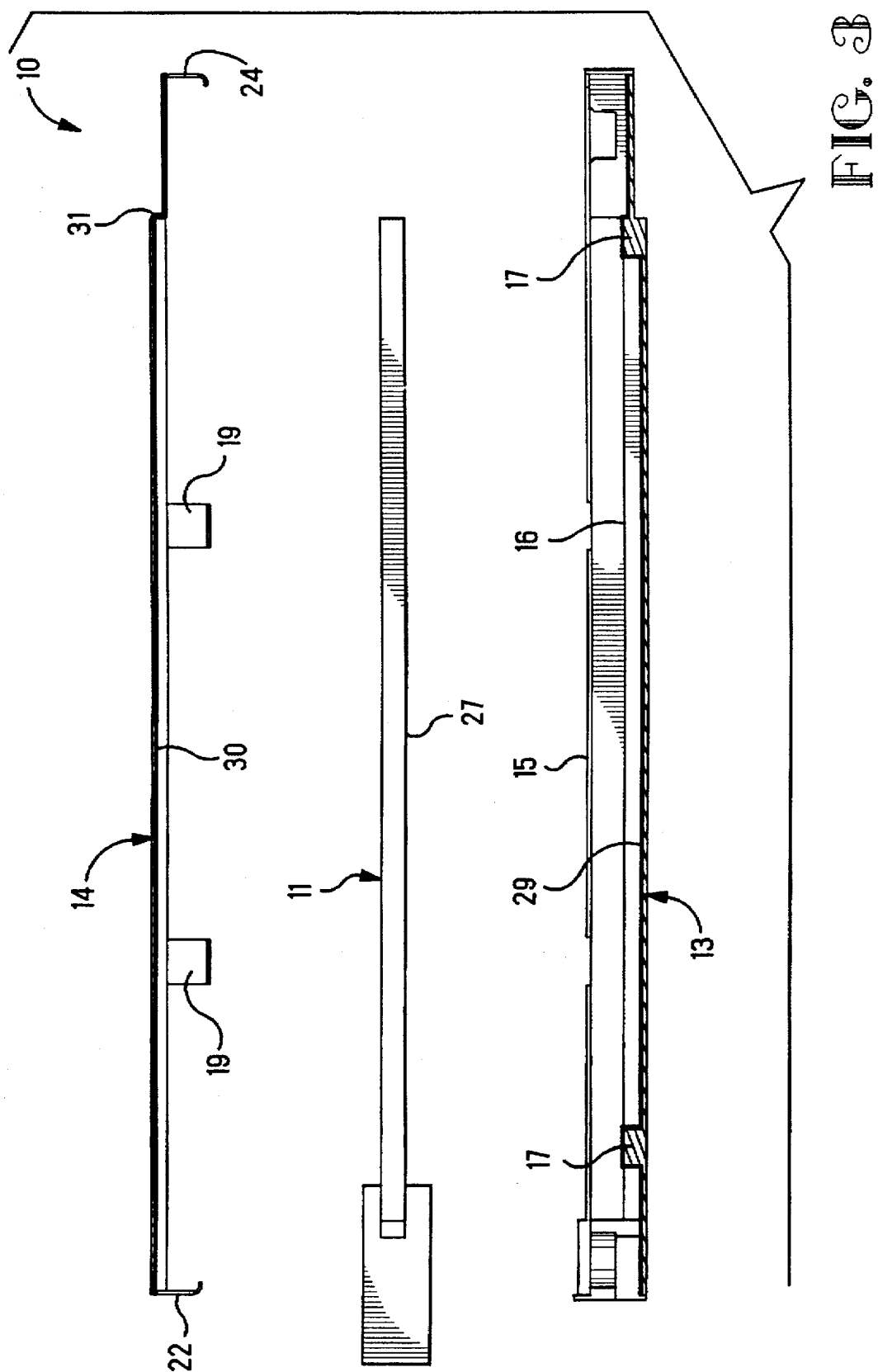
FIG. 3 is a longitudinal sectional view thereof, taken along the lines 3—3 of FIG. 2.

With reference to FIGS. 1 and 2, the card holder 10 of the present invention is generally rectangular, preferably, and completely encloses a card 11 for cooperation with a computer 12.

It will be appreciated by those skilled in the art, however, that in FIG. 1 the computer 12 is a schematic illustration of any type of electronic equipment having computer capabilities; that the card 11 (for example) may be a printed circuit board ("PCB") constituting a memory card; and that the teachings of the present invention are equally applicable to a wide variety of cards and related computers. Moreover, the particular I/O connection or interface between the card 11 and the computer 12 (being old) has been omitted for ease of illustration.

With this in mind, and with reference to FIGS. 3–9, the card holder 10 includes a bottom member 13 and a top member or cover 14 with the card 11 therebetween. The bottom member 13 has a pair of longitudinal side ribs 15, each of which is provided with a longitudinal ledge 16, and the bottom member 13 further has a pair of spaced-apart transverse ribs 17. These transverse ribs 17 provide enhanced structural rigidity for the bottom member 13 and, together with the longitudinal ledges 16, support the card 11.

The top cover 14 has respective side edges 18, each of which is provided with a pair of spaced-apart hooks 19; and these hooks 19 are received in cooperating complementary recesses 20 formed in the bottom member 13. Moreover, the top cover 14 has end edges 21, each of which is provided with spaced-apart flanges 22 received in cooperating complementary recesses 23 formed in the bottom member 13. The end edges 21 of the top cover 14 also have respective hooks 24 for cooperation with further recesses 25 in the bottom member 13. As a result, the top cover 14 is easily snapped over the bottom member 13 and fully encloses the card 11 for substantially complete E.M.I. shielding.

The bottom member 13 is made of aluminum and, in a preferred embodiment, is formed by a precision hot-flow semi-solid forging operation. Alternatively, the bottom member 13 may be a precision die-cast aluminum casting. The top member 14, on the other hand, is made of either aluminum or stainless steel and is formed in a progressive stamping operation. These forging and stamping operations, being well known, have been omitted for ease of illustration. Of significance, however, these parts (and in particular the bottom member 13) are formed economically without resorting to an injection-molded plastic part; and the parts are easily snapped together to complete the assembly, economically, and without any special tools, fixtures, presses or adhesives.

Depending upon the particular application of the card holder 10, electrical insulation must be provided to electrically insulate the card 11 from the metal parts, namely, the bottom member 13 and its top cover 14. The bottom member 13 has a substantially planar surface 26 which confronts the planar surface 27 of the card 11. For relatively high-voltage applications, a separate relatively-thin insulation layer 28 is inserted between these confronting planar surfaces 26 and 27, respectively, as shown more clearly in FIG. 6. For lower-voltage applications, the aluminum bottom member 13 may be anodized as at 29 in FIG. 3. If the top cover 14 is made of aluminum, it may be anodized as well as at 30. If desired, the entire surface of the top cover 14 and/or the bottom member or frame 13 may be anodized to provide a pleasing product appearance.

Thus, the present invention provides a rugged and reliable cost-effective card holder 10 (preferably shielded) and including a bottom precision member 13 formed by a hot-flow semi-solid aluminum forging operation (or, possibly, as a precision die casting). A molded plastic frame (lacking the desired strength and rigidity) and its separate injection molding operation—heretofore habitually reported to in the prior art—is completely eliminated. A single stamped top cover 14 is sufficient to secure the card 11 within the card holder 10. Yet the card holder 10 provides substantially complete E.M.I. shielding together with electrical insulation between the card 11 and the holder 10, the type of insulation depending upon the voltage requirements of the particular application.

With reference again to FIG. 3, the top cover (as well as the bottom member) may have a bend 31 for additional structural rigidity per the so-called "Type III" PCMCIA industry specification or configuration for shielded card holders. The present invention, however, is equally applicable to the "Type I" and "Type II" industry configurations which do not have a bend 31, nor its equivalent, and hence are thinner. The PCMCIA standards define various tests and operational performances that must be met by the type I, II and III cards.

Obviously, many modifications may be made without departing from the basic spirit of the present invention. Accordingly, it will be appreciated by those skilled in the art that within the scope of the appended claims, the invention may be practiced other than has been specifically described herein.

I claim:

1. A card holder for a card used in computers and related equipment comprising:

a single unitary bottom member fabricated from a metal having a high strength modulus and adapted to serve directly as a rigid frame for a card; and a stamped top member adapted to be snapped over said bottom member after a card has been disposed in said bottom member to complete the assembly of the card holder, whereby upon disposing said card in said bottom member and assembling said card holder, said bottom member provides high mechanical strength and rigidity and said top member serves merely as a cover without being required to generate mechanical strength in the assembly.

2. The card holder of claim 1, wherein the unitary bottom member is formed as a hot-flow semi-solid precision forging of an aluminum material.

3. The card holder of claim 1, wherein the unitary bottom member is formed as a die-cast aluminum casting.

4. The card holder of claim 2, wherein the top member comprises an aluminum stamping, wherein the aluminum material of the members provides good EMI shielding, and wherein each of the members is hard anodized, thereby providing for electrical insulation between the card and the members.

5. The card holder of claim 4, wherein the card comprises a PCB.

6. The combination of claim 4, wherein the bottom member has respective longitudinal side ribs, each of which is provided with a longitudinal ledge, and wherein the bottom member further has a pair of spaced-apart transverse ribs communicating with the ledges, such that the card is supported upon the longitudinal ledges and transverse ribs, respectively.

7. The card holder of claim 4, wherein the top member has respective side edges, each of which is provided with a pair of spaced-apart hooks, and wherein the bottom member is provided with a pair of spaced-apart cooperating recesses receiving the hooks, such that the top member is snapped on to the bottom member.

8. The card holder of claim 4, further including a separate thin insulation layer disposed between the card and the bottom member.

* * * * *